(12) United States Patent
Lee et al.

(10) Patent No.: US 9,660,216 B2
(45) Date of Patent: May 23, 2017

(54) LIGHT-TRANSMITTING ADHESIVE FILM AND DISPLAY DEVICE COMPRISING THE SAME

(71) Applicant: Samsung Display Co., Ltd., Yongin-si, Gyeonggi-do (KR)

(72) Inventors: Taeho Lee, Seoul (KR); Chanjae Park, Gyeonggi-do (KR); Chungseok Lee, Gyeonggi-do (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1 day.

(21) Appl. No.: 14/703,524

(22) Filed: May 4, 2015

(65) Prior Publication Data
US 2016/0111678 A1    Apr. 21, 2016

(30) Foreign Application Priority Data
Oct. 21, 2014    (KR) ........................ 10-2014-0142550

(51) Int. Cl.
*H01L 51/52*    (2006.01)
*C09J 7/00*    (2006.01)
*C09J 9/00*    (2006.01)

(52) U.S. Cl.
CPC ............ *H01L 51/5246* (2013.01); *C09J 7/00* (2013.01); *C09J 9/00* (2013.01); *C09J 2201/622* (2013.01); *C09J 2203/318* (2013.01); *H01L 51/5281* (2013.01)

(58) Field of Classification Search
CPC ........... H01L 2251/558; H01L 27/3225; H01L 51/5293
See application file for complete search history.

(56) References Cited

U.S. PATENT DOCUMENTS

| | | | |
|---|---|---|---|
| 2004/0015187 A1* | 1/2004 | Lendlein ......... | A61B 17/06166 606/228 |
| 2009/0291608 A1 | 11/2009 | Choi et al. | |
| 2012/0314160 A1* | 12/2012 | Hwang ............... | G02B 5/3041 349/96 |
| 2012/0329956 A1* | 12/2012 | Prenzel ..................... | C09J 9/00 525/370 |
| 2014/0097412 A1* | 4/2014 | Kuo ........................ | G02B 5/30 257/40 |
| 2014/0111954 A1 | 4/2014 | Lee et al. | |
| 2014/0192297 A1* | 7/2014 | Choi .................. | G02F 1/13363 349/96 |
| 2014/0295150 A1* | 10/2014 | Bower ...................... | C09J 7/02 428/201 |
| 2015/0109814 A1* | 4/2015 | Chen ..................... | G02B 6/005 362/606 |

(Continued)

FOREIGN PATENT DOCUMENTS

| | | |
|---|---|---|
| KR | 10-2006-0094816 A | 2/2007 |
| KR | 10-2008-0004026 A | 1/2008 |
| WO | WO 2012/002590 A1 | 1/2012 |

*Primary Examiner* — Caridad Everhart
*Assistant Examiner* — Ankush Singal
(74) *Attorney, Agent, or Firm* — Knobbe Martens Olson & Bear LLP

(57) ABSTRACT

A light-transmissive adhesive film includes an adhesive layer in which an elastic modulus in a second area is higher than that in a first area, and also includes release layers on upper and lower portions of the adhesive layer.

20 Claims, 4 Drawing Sheets

(56) References Cited

U.S. PATENT DOCUMENTS

2015/0130110 A1* 5/2015 Browne ............... B60R 13/04
                                                                                 264/263
2016/0109631 A1* 4/2016 Mizutani ............. C09J 7/0235
                                                                                  156/249

* cited by examiner

LIGHT-TRANSMITTING ADHESIVE FILM AND DISPLAY DEVICE COMPRISING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims priority to and the benefit of Korean Patent Application No. 10-2014-0142550, filed on Oct. 21, 2014, with the Korean Intellectual Property Office, the disclosure of which is incorporated herein in its entirety by reference.

BACKGROUND

Field

The disclosure relates to a light-transmissive adhesive film and a display device including the same.

Description of the Related Technology

Transition from an industrial society to an information society indicates the importance of electronic displays that allow a lot of information from several different kinds of devices to be visible and transmit the visual information to humans, which has led to vigorous growth of display devices. Such display devices are categorized into two types: self-emissive displays including a cathode ray tube (CRT) display, an electroluminescent display (ELD), a vacuum fluorescent display (VFD), a field emission display (FED) and a plasma display panel (PDP); and non-self-emissive displays including a liquid crystal display (LCD).

The importance of display devices has been further emphasized as visual information transmission media in the recent information society, and in order to assume an important position in the future, the display devices should meet requirements such as low power consumption, lightweight, slimness, high definition, and high transparency.

A display device includes a display panel that displays an image, a layer that protects the display panel from external impact or scratch, and an optically clear adhesive (OCA) film that bonds the display panel and layer together.

The OCA film generally includes a material, e.g. an acrylic-based material, having high adhesion and transparency, and good mechanical properties.

However, conventional OCA films have a relatively high elastic modulus, and thus shear failure takes place at the time of elongation. The shear failure usually occurs in a display device that has a circular shape.

Where the OCA film includes a material having a relatively low elastic modulus, there are difficulties handling and manipulating in a process of, for example, removal of release paper, and further an end portion of the OCA film is subjected to large deformations when compared to the OCA film including a material with a high elastic modulus. In addition, delamination occurs because the OCA film has lower adhesive strength due to poor mechanical properties.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding effective filing dates of subject matter disclosed herein.

SUMMARY

Some embodiments of the disclosure are directed toward a light-transmissive adhesive film having high elongation and adhesive strength while its optical and mechanical properties are not decreased.

An embodiment is directed toward a light-transmissive adhesive film including two areas having different elastic moduli.

Further, another embodiment is directed toward a light-transmissive adhesive film having a low elastic modulus in a region where tensile stress occurs when folded.

Another embodiment is directed to a light-transmissive adhesive film which includes an adhesive layer in which an elastic modulus in a second area is higher than that in a first area; and one or more release layers on upper and lower portions of the adhesive layer.

The adhesive layer may include the first and second areas that are alternately located.

The adhesive layer may include one or more second areas.

The adhesive layer may have an elastic modulus in a range of 0.2 MPa to 0.5 MPa in the first area.

The adhesive layer may include a polymer that is reversibly photocrosslinkable.

The polymer may include an organic functional group that undergoes a reaction of [2+2] cycloaddition or photocleavage by ultraviolet light.

The adhesive layer may have a thickness in a range of 10 μm to 80 μm.

The first area of the adhesive layer may have a linear shape.

The first area of the adhesive layer may have a width more than twice as large as the thickness of the adhesive layer.

According to an exemplary embodiment, a display device includes a display panel; a first adhesive layer on a surface of the display panel; and a polarizer on the first adhesive layer. The first adhesive layer may have an elastic modulus in a second area, which is higher than that in a first area.

The display device may further include a second adhesive layer on the polarizer. The second adhesive layer may have an elastic modulus in a second area, which is higher than that in a first area.

The display device may further include a protective layer on the second adhesive layer.

The first area of the second adhesive layer may have a smaller width than that of the first area of the first adhesive layer.

The display device may further include a third adhesive layer on the other surface of the display panel. The third adhesive layer may have an elastic modulus in a second area, which is higher than that in a first area.

The display device may further include a support layer on the third adhesive layer.

The first area of the third adhesive layer may have a larger width than that of the first area of the second adhesive layer.

The adhesive layer may include the first and second areas that are alternately located.

The adhesive layer may have an elastic modulus in a range of 0.2 MPa to 0.5 MPa in the first area.

The adhesive layer may have a thickness in a range of 10 μm to 80 μm, and the first area of the adhesive layer may have a width more than twice as large as the thickness of the adhesive layer.

The display panel may be an OLED.

According to some embodiments, a light-transmissive adhesive film includes at least two areas having different elastic moduli from each other. Therefore, the light-transmissive adhesive film may have high adhesive strength and simultaneously, it may not be easily damaged even when folding and unfolding is repeated for a long period of time. The light-transmissive adhesive film may be applied to a display device such as, for example, a foldable or bendable display device.

The foregoing is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
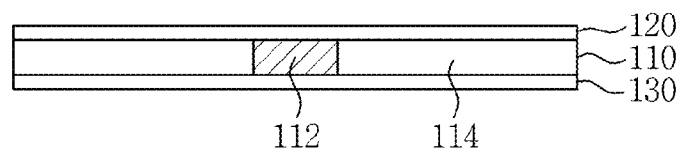
FIG. 1 is a cross-sectional view illustrating an exemplary embodiment of a light-transmissive adhesive film.

Advantages and features of the disclosure and methods for achieving thereof will be made clear from exemplary embodiments described below in detail with reference to the accompanying drawings. The present teachings may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. Like reference numerals refer to like elements throughout the specification.

The spatially relative terms "lower," "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "lower" another device may be placed "upper" another device. Accordingly, the illustrative term "lower" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, an exemplary embodiment of a light-transmissive adhesive film will be fully described with reference to FIG. 1.

FIG. 1 is a cross-sectional view illustrating an exemplary embodiment of a light-transmissive adhesive film.

Referring to FIG. 1, the light-transmissive adhesive film 100 according to one exemplary embodiment includes an upper release layer 120, a lower release layer 130 opposing the upper release layer 120, and an adhesive layer 110 between the upper and lower release layers 120 and 130.

The upper and lower release layers 120 and 130 may be configured to temporarily protect an adhesive surface of the adhesive layer 110 from contamination caused by dust, moisture, and other contaminants.

The upper and lower release layers 120 and 130 may be a plastic film including, but not limited to, polyimide, polyethylene terephthalate (PET), polyethylene naphthalate (PEN), polyethersulfone (PES), nylon, polytetrafluoroethylene (PTFE), polyetheretherketone (PEEK), polycarbonate, or polyarylate.

The upper and lower release layers 120 and 130 may act as a substrate. When a completed light-transmissive adhesive film is attached to a display device, the release layers 120 and 130 may be removed from the completed light-transmissive adhesive film. Where the release layers 120 and 130 include a light-transmissive material, they may also be attached to the display device together with the completed light-transmissive adhesive film.

The adhesive layer 110 may be configured to bond a display panel, layer, and/or a touch film to each other. The adhesive layer 110 will be further described below.

The adhesive layer 110 may include, as a primary element, a compound that can undergo reversible photocrosslinking (Formula 1), namely [2+2] cycloaddition (hv) or photocleavage (hv¹), by ultraviolet light. The compound capable of undergoing the reversible photocrosslinking may be a polymer including an organic functional group, which can undergo the [2+2] cycloaddition, such as, for example, a cinnamyl group (Formula 2), a coumarin group (Formula 3), and an anthracene group (Formula 4).

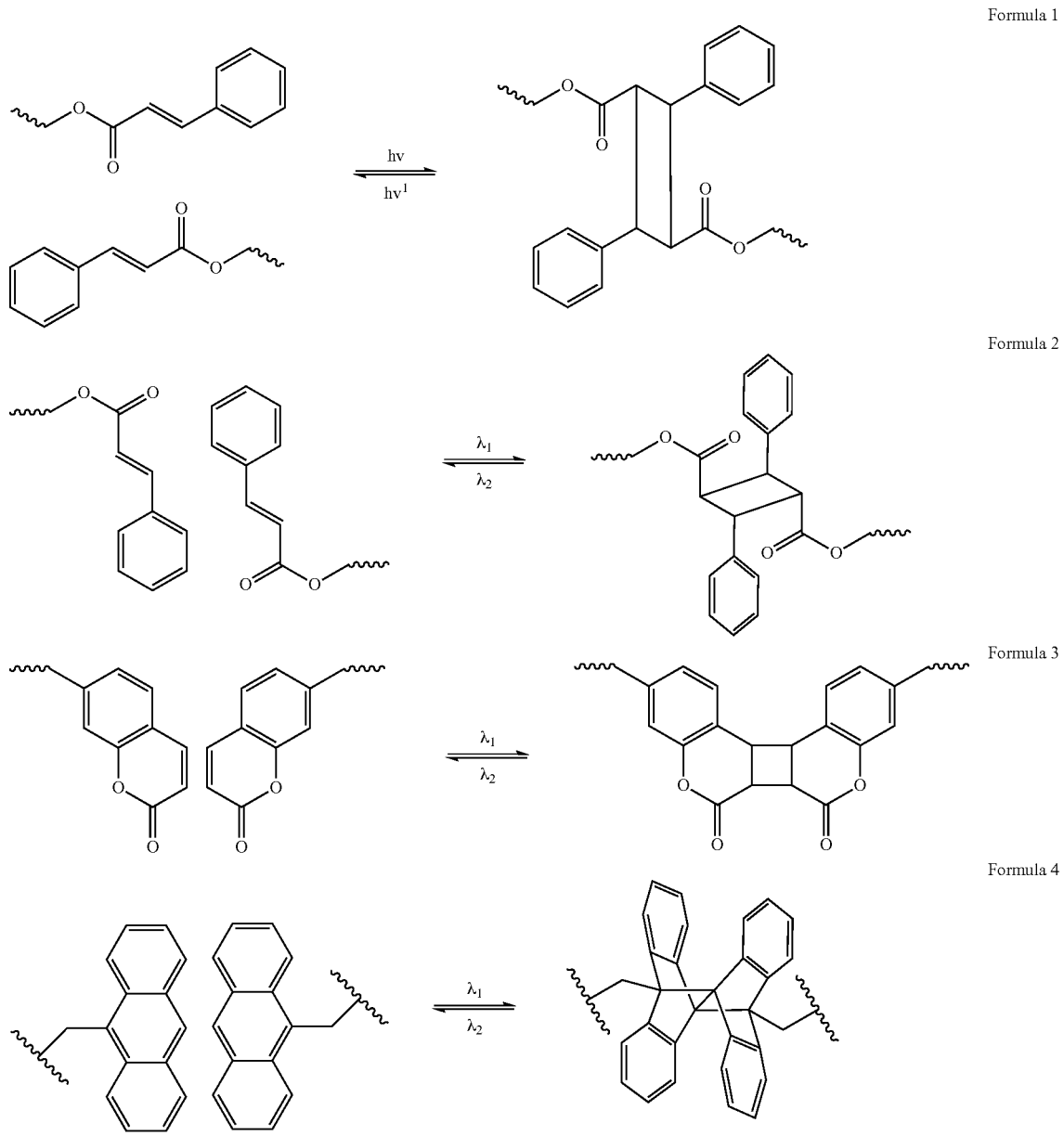

A method of forming the adhesive layer 110 may be similar to a method of forming existing optically clear adhesive (OCA). However, that is a difference between the adhesive layer 110 and the existing OCA in that the adhesive layer 110 may primarily include shape-memory polymers (SMPs) that have the ability to return from a deformed state (temporary shape) to their original (permanent) shape.

According to some embodiments, the primary element of the adhesive layer 110 may be a compound in which a ring is formed by the cycloaddition and is then cleaved by the photocleavage. The compound suitable for photocrosslinking may also be called a light-activated shape-memory polymer (LASMP).

Examples of the compound suitable for photocrosslinking may include a siloxane chain or an aliphatic chain as a backbone chain. The compound suitable for photocrosslinking may desirably be a polymer in which the backbone chain is modified (grafted) with about 30% to about 60% of a functional group such as a cinnamyl group, a coumarin group, and an anthracene group.

Examples of the backbone chain may include polydimethylsiloxane (PDMS) that is a siloxane chain, silicone polyurea block copolymer, or the like, and the backbone chain may include MQ resin so as to have a three-dimensional (3D) network structure.

The adhesive layer 110 may further include 2-ethylhexyl acrylate (2EHA), isobornyl acrylate (IBOA), hydroxyethyl acrylate (HEA), hydroxybutyl acrylate (HBA), hydroxypropyl acrylate (HPA), hexyl methacrylate (HMA), and/or monomers, photoinitiators, hardeners or curatives, and other additives, which are selected from combinations thereof, in addition to the compound suitable for photocrosslinking as a primary element.

According to an exemplary embodiment, the adhesive layer 110 may include the compound suitable for photocrosslinking, and thus a cycloaddition may occur during ultraviolet (UV) light irradiation so that the adhesive layer 110 may have a relatively high elastic modulus. In contrast, the adhesive layer 110 may undergo cleavage such as to have a relatively low elastic modulus.

Therefore, the adhesive layer 110 may have high adhesion and may also provide an adhesive film with high stretchability.

The adhesive layer 110 will be further described below with reference to FIGS. 1 to 7.

As illustrated in FIG. 1, the adhesive layer 110 may be partitioned into two areas: a first area 112 having a predetermined elastic modulus and a second area 114 having a higher elastic modulus than that of the first area 112.

The first area 112 may be formed by photocleavage of a polymer suitable for photocrosslinking by UV light irradiation. The first area 112 may have a variety of shapes such as a circle in accordance with a shape of a mask pattern, and it may be more desirable to have a linear shape. However, the scope of the present disclosure is not limited to the shape of the first area 112.

There may be a difference in elastic modulus between the first area 112 irradiated with UV light and the second area 114 which is not irradiated with UV light. For instance, the first area 112 may have a lower elastic modulus than that of the second area 114, and it may desirably have an elastic modulus in a range of 0.2 MPa to 0.5 MPa.

Figure 2:
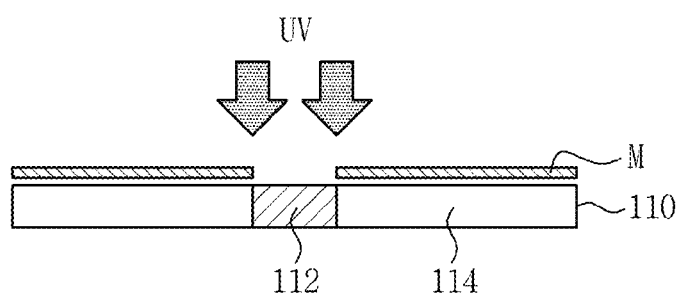
FIG. 2 is a diagram illustrating a process of irradiating ultraviolet light to a first area of an adhesive layer included in the light-transmissive adhesive film shown in FIG. 1.
Figure 3:
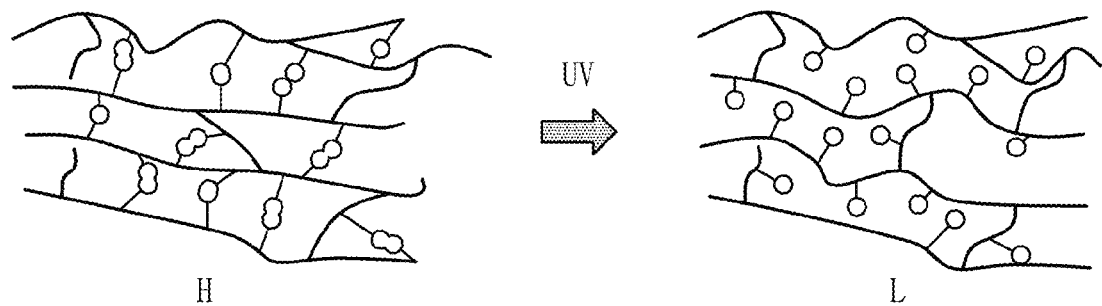
FIG. 3 is a schematic diagram illustrating photolysis (photodecomposition) occurring in the first area shown in FIG. 2.

Referring to FIGS. 2 and 3, bonding(s) in photocrosslinkable sites of the compound that can undergo photocrosslinking as a primary component of the adhesive layer 110 may be broken by UV light irradiation onto the first area 112. In other words, a highly cross-linked polymer (hereinafter referred to as "H") may be converted to a low cross-linked elastomer (hereinafter referred to as "L").

Due to the UV light irradiation, the adhesive layer 110 may be divided into the two areas: the first area 112 including the "L" having a low elastic modulus and the second area 114 including the "H" having a relatively high elastic modulus.

Figure 4:
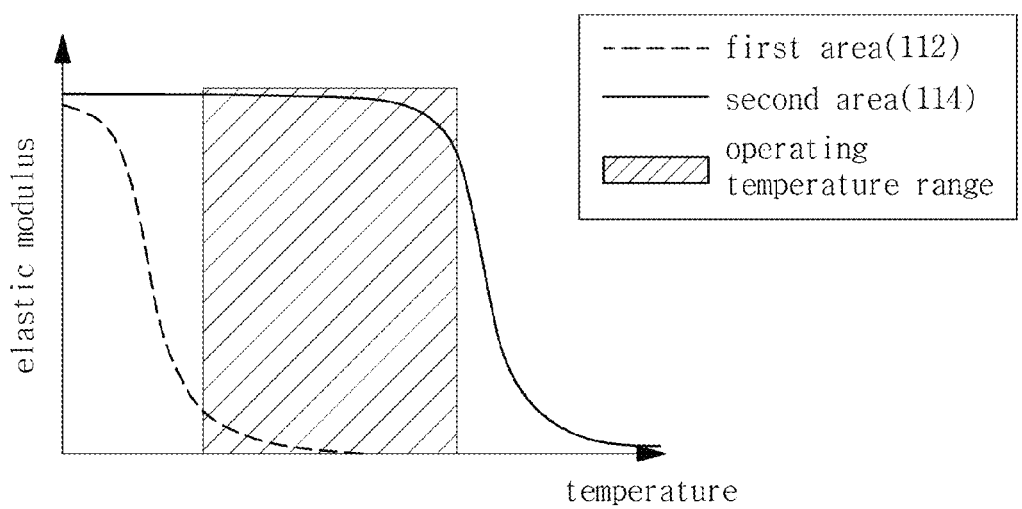
FIG. 4 is a graph showing comparisons between elastic moduli in first and second areas of an adhesive layer included in a light-transmissive adhesive film according to an embodiment.

FIG. 4 provides a graph showing comparisons between elastic moduli in the first and second areas 112 and 114 of the adhesive layer 110 according to an exemplary embodiment. In the graph of FIG. 4, the horizontal axis indicates temperatures and the vertical axis indicates elastic moduli. Further, the dashed line in the graph shows an elastic modulus of the first area 112 to which UV light is irradiated, and the solid line in the graph shows an elastic modulus of the second area 114 to which UV light is not irradiated.

Referring to the graph of FIG. 4, the elastic modulus of the second area 114 may be higher than that of the first area 112 in an operating temperature range (a display area). The first area 112 with a low elastic modulus may have elastic properties and the second area 114 with a relatively high elastic modulus may be rigid (or stiff).

Therefore, the adhesive layer 110 may provide an adhesive film that has rigidity (or stiffness) as well as elasticity.

Further, the adhesive layer 110 may be repeatedly folded and bent because the first area 112 having a low elastic modulus may act as a foldable part. Although folding and unfolding repeatedly occurs, shear failure (shear fracture) may not be caused, and thus the first area 112 may serve as the foldable part when the adhesive layer 110 is applied to a foldable display device.

The adhesive layer 110 may desirably have a thickness in a range of 10 μm to 80 μm. The first and second areas 112 and 114 may have widths that are not specifically restricted. However, it is preferable that the width of the first area 112 be more than twice as large as the thickness of the adhesive layer 110 so that the first area 112 may act as the foldable part when the adhesive layer 110 is applied to a foldable display device.

Figure 5:
FIG. 5 is a cross-sectional view illustrating an embodiment of a light-transmissive adhesive film.

Referring to FIG. 5, an adhesive layer may include first and second areas that are alternately disposed, and further the adhesive layer may include one or more second areas.

Figure 6:
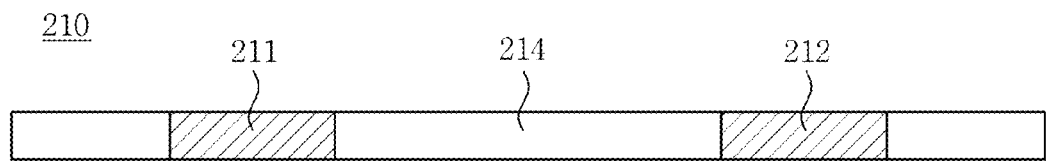
FIG. 6 is a plan view illustrating an adhesive layer included in the light-transmissive adhesive film shown in FIG. 5.

Referring to FIGS. 5 and 6, a light-transmissive adhesive film 200 according to an exemplary embodiment includes an upper release layer 220, a lower release layer 230, and an adhesive layer 210. The adhesive layer 210 may be partitioned into two first areas 211 and 212 and a second area 214 that is alternately disposed with the two first areas 211 and 212.

In order to distinguish the two first areas 211 and 212 from each other, different reference numerals 211 and 212 are used for the first areas 211 and 212 respectively disposed on left and right sides of the adhesive layer 210. The light-transmissive adhesive film 200 has the same configuration as the light-transmissive adhesive film 100 illustrated in FIG. 1, and further description of the same configuration will be omitted with regard to the light-transmissive adhesive film 200 for brevity.

Referring to FIG. 6, the first areas 211 and 212 to which UV light is irradiated and the second area 214 to which UV light is not irradiated may have different elastic moduli from each other. For instance, the first areas 211 and 212 may have a lower elastic modulus than the second area 214 and may desirably have an elastic modulus in a range of 0.2 MPa to 0.5 MPa. Therefore, the adhesive layer 210 may be repeatedly folded and bent because the first areas 211 and 212 having a low elastic modulus serve as a folding part.

Figure 7:
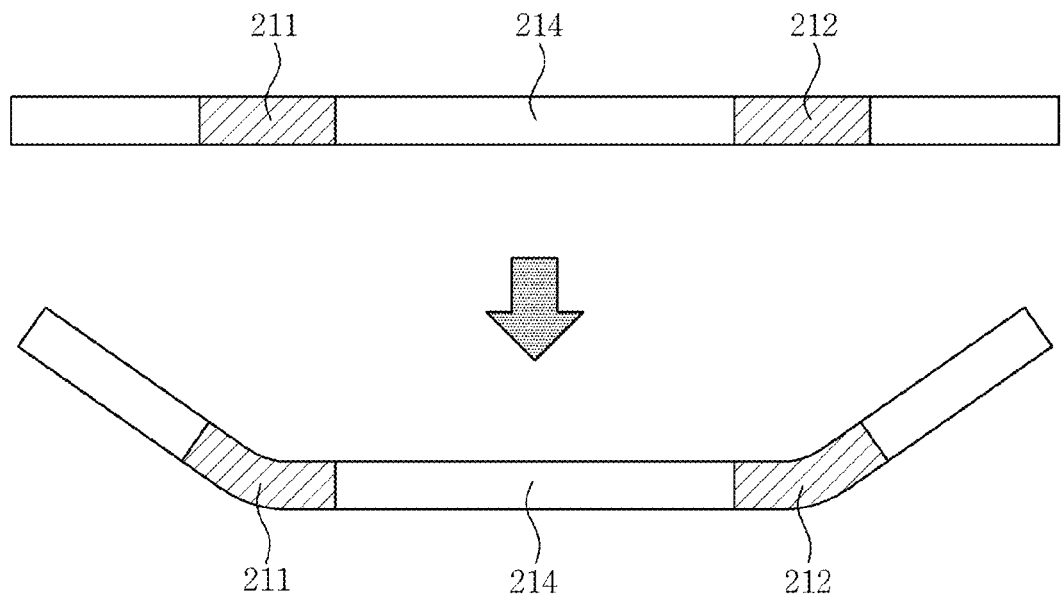
FIG. 7 is a diagram illustrating a state in which the adhesive layer shown in FIG. 6 is folded at a first area thereof.

As illustrated in FIG. 7, when the adhesive layer 210 is applied to a foldable display device, the first areas 211 and 212 may act as folding parts. FIG. 7 illustrates infoldings of the first areas 211 and 212 respectively disposed on left and right sides of the adhesive layer 210, both of which fold inward, but the shape of the first areas 211 and 212 is not limited thereto.

Where the adhesive layer 210 is applied to a multi-folding (or multi-purpose folding) display device, the first areas 211 and 212 respectively disposed on left and right sides of the adhesive layer 210 may vary widely in shape depending on uses or purposes thereof. In an exemplary embodiment, the first areas 211 and 212 respectively disposed on left and right sides of the adhesive layer 210 may have outfolding shapes, both of which fold outward, or the first areas 211 and 212 may be folded in different directions from each other.

Figure 8:
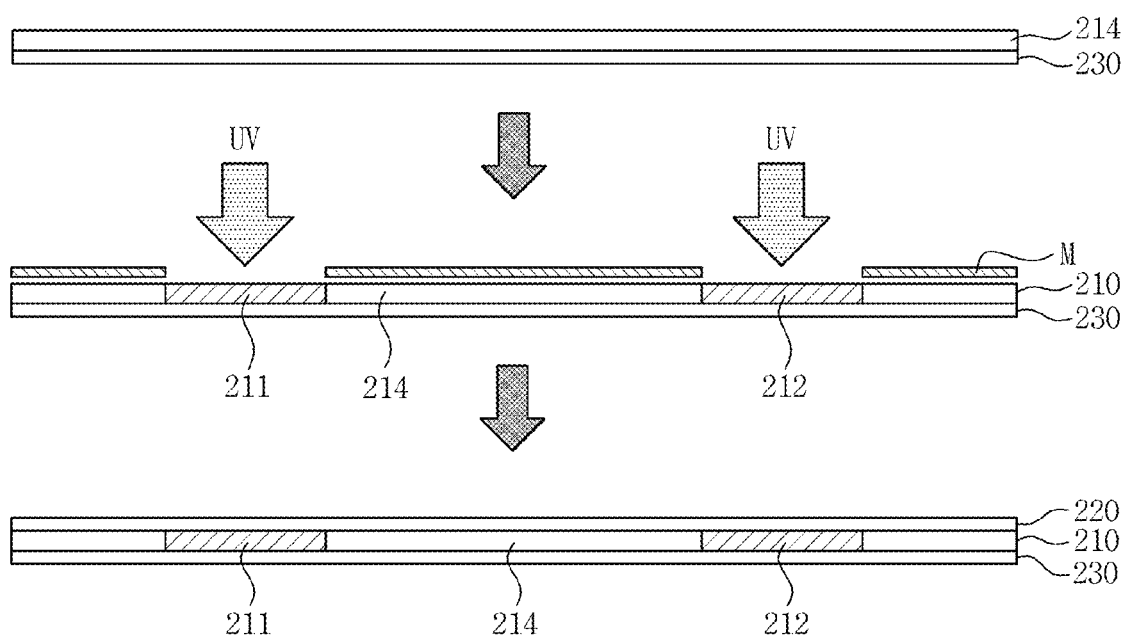
FIG. 8 is a schematic diagram illustrating a manufacturing process of the light-transmissive adhesive film shown in FIG. 2.

FIG. 8 is a schematic diagram illustrating a manufacturing process of the light-transmissive adhesive film 200 according to an exemplary embodiment. Manufacturing of the adhesive layer 210 including the first areas 211 and 212 respectively disposed on left and right sides of the adhesive layer 210 will be described with illustrations as an exemplary embodiment. Herein, the reference numeral of the second area 214 will be used for a preliminary adhesive layer including only the second area 214 for ease of understanding the manufacturing process.

First, an adhesive composition including a polymer suitable for photocrosslinking may be applied to a surface of the lower release layer 230, thereby forming the preliminary adhesive layer 214. The polymer used to form the preliminary adhesive layer 214 may have strong bonding(s) in photocrosslinkable sites. The coated preliminary adhesive layer 214 may include only the second area 214 that has a relatively high elastic modulus.

Next, UV light may be irradiated from the preliminary adhesive layer 214 to the first areas 211 and 212, thereby forming the adhesive layer 210 in which the first areas 211 and 212 with a low elastic modulus are alternately disposed with the second area 214 having a high elastic modulus. The level of the UV radiation may desirably be about 300 nm or less.

Finally, the upper release layer 220 may be disposed on the adhesive layer 210 so as to oppose the lower release layer 230, thereby fabricating the light-transmissive adhesive film 200 with elasticity and rigidity (or stiffness).

In the above fabricating process, the adhesive layer 210, the upper release layer 220, and the lower release layer 230 may be consistent with the light-transmissive adhesive film 100 illustrated in FIG. 1, and thus detailed description thereof will be omitted for brevity.

Figure 9:
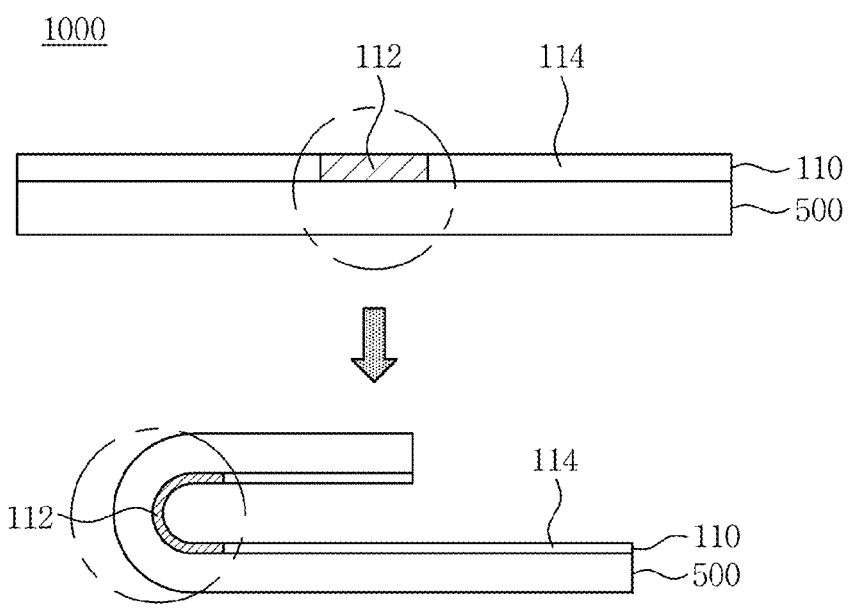
FIG. 9 is a diagram illustrating an embodiment of an application of the light-transmissive adhesive film shown in FIG. 1 to a foldable display device.

FIG. 9 is a diagram illustrating an exemplary embodiment of the adhesive layer 110 of the light-transmissive adhesive film 100 shown in FIG. 1, which is applied to a foldable (or bendable) display device 1000.

Referring to FIG. 9, the foldable (or bendable) display device 1000 may include a display panel 500 that is foldable like, for example, an OLED display, and also include the adhesive layer 110 attached to an image display surface of the display panel 500. According to an exemplary embodiment, where the release layers 120 and 130 are removed from the light-transmissive adhesive film 100, the adhesive layer 110 may be attached to the display panel 500, or the release layers 120 and 130 may be attached to the display panel 500, together with the adhesive layer 110.

As described above, the foldable (or bendable) display device 1000 may be repeatedly bent or folded without fear of shear failure of the adhesive layer 110 due to the use of the light-transmissive adhesive film 100 having elasticity and rigidity.

A display device according to an exemplary embodiment includes a display panel, a first adhesive layer on a surface of the display panel, and a polarizer on the first adhesive layer.

The display device may further include a second adhesive layer on the polarizer and a protective layer, and may also include a third adhesive layer on the other surface of the display panel and a support layer.

As described above, the first, second and third adhesive layers may be respectively divided into first and second areas, and the first areas may have widths that vary with a position of the display device. In other words, the first, second and third adhesive layers applied to the display device may include the first areas of which the widths are different from each other or all the same.

Figure 10:
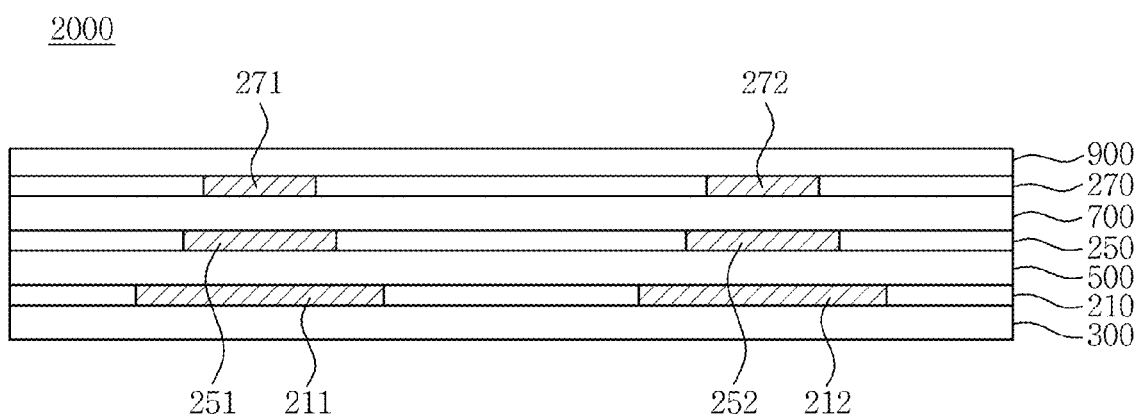
FIG. 10 is a cross-sectional view illustrating an embodiment of a display device.

FIG. 10 is a cross-sectional view illustrating an exemplary embodiment of a foldable display device 2000. The foldable display device 2000 may include the light-transmissive adhesive film 200 illustrated in FIG. 5. Accordingly, the same reference numerals will be used for the same or corresponding components and repeated description of the light-transmissive adhesive film 200 will not be provided below.

Referring to FIG. 10, the foldable display device 2000 may include a support layer 300, a first adhesive layer 210, a display panel 500, a second adhesive layer 250, a polarizer 700, a third adhesive layer 270, and a protective layer 900.

A width of the first area that is a folding part of the foldable display device 2000 may desirably be more than twice as large as a thickness of the adhesive layer, and the width of the first area may vary depending on a position applied with the adhesive layer in consideration of the radius of curvature.

Referring to FIG. 10, the first adhesive layer 210 between the support layer 300 and the display panel 500, the second adhesive layer 250 between the display panel 500 and the polarizer 700, and the third adhesive layer 270 between the polarizer 700 and the protective layer 900 may differ from each other in terms of the widths of the first area.

The first areas 211 and 212 of the first adhesive layer 210 may be larger in width than the first areas 251 and 252 of the second adhesive layer 250. The first areas 251 and 252 of the second adhesive layer 250 may desirably be larger in width than the first areas 271 and 272 of the third adhesive layer 270.

A method of manufacturing the foldable display device 2000 utilizing the light-transmissive adhesive film 200 according to an exemplary embodiment may be similar to a manufacturing method of a conventional foldable display device. The difference may lie in that an adhesive layer between members included in the display device has the first area and the second area having a higher elastic modulus than the first area.

A method of manufacturing the adhesive layer, which is a difference between the manufacturing methods of a conventional foldable display device and the foldable display device 2000 according to an exemplary embodiment, has been described above with reference to FIG. 8. Thus, the manufacturing method of the foldable display device 2000 will be omitted.

Exemplary embodiments below are for illustrative purposes only, and the scope of the invention is not limited to the exemplary embodiments.

Example 1

Acrylic Adhesive Composition

Synthesis of Poly(MMA-co-HEMA)

Methyl methacrylate (MMA) reacts with 2-hydroxyethyl methacrylate (HEMA) by free radical polymerization (MMA/HEMA=60 mol/40 mol, MMA 10 g, HEMA 8.67 g, methanol 50 mL, AIBN (0.5 g, 2.5 wt %)). The polymerization is performed under a nitrogen atmosphere at 80° C. for 24 hours. A product resulting from the reaction is poured into diethyl ether such as to be precipitated and isolated from diethyl ether. The isolated precipitate is dried in a vacuum atmosphere at 65° C. for 24 hours to obtain a poly(MMA-co-HEMA) (co)polymer.

Synthesis of Poly(MMA-co-HEMA) Modified With a Cinnamoyl Group

Poly(MMA-co-HEMA) (7 g) is dissolved in distilled tetrahydrofuran (THF) (50 mL) and triethylamine (TEA) (4.56 g) is slowly added thereto. Cinnamoyl chloride (5 g) is dissolved in THF (10 mL) and is then added dropwise to the reaction mixture. The reaction mixture is wrapped in aluminium foil so as to be shielded from light and carried out at 0° C. for 24 hours. Next, THF is removed using a rotary evaporator, and then the resulting residue is dissolved in ethyl ether and then poured into petroleum ether such as to be precipitated and isolated from diethyl ether. The isolated precipitate is dried under vacuum at 65° C. for 24 hours to obtain poly(MMA-co-HEMA) modified with about 40% of a cinnamoyl group.

Manufacturing of an Adhesive Composition 100 parts by weight of poly(MMA-co-HEMA) (a molecular weight of 100,000 to 2,000,000) modified with a cinnamoyl group, 70 parts by weight of polyacrylate (a molecular weight of 50 to 200), and 30 parts by weight of acryloyl morpholine are mixed with one another, and then Irgacure 651 (photoinitiator, Ciba Specialty Chemicals, Switzerland) 0.5 wt %, 3-methacryloxypropyltrimethoxysilane (a coupling agent) 0.5 wt %, and toluene diisocyanate 1.0 wt % are added to the mixture in such a manner as to manufacture an acrylic adhesive composition.

Formation of an Adhesive Layer

The manufactured acrylic adhesive composition is bar coated onto PET film (50 μm; SGOO, SKC, Seoul, KOREA) that is backing film and is irradiated with UV light for 3 minutes to be cured into a transparent adhesive film. The adhesive layer has a thickness of about 15 μm.

Evaluation (Adhesion Testing)

A method for testing adhesion strength uses ASTM D3330, which is the standard test method. The adhesive layer is stored in an oven at 100° C. for 5 minutes to measure adhesive strength thereof.

Durability of the adhesive layer is measured under conditions such as high temperature and high humidity. The transparent adhesive film is coated on a glass and an ITO film is laminated onto the adhesive film such that the adhesive film is stored for 240 hours under conditions such as 85/85 (temperature/humidity). After the storage, the durability is measured through observation of appearance.

Example 2

Silicone Adhesive Composition

Manufacturing of Polydimethylsiloxane (PDMS) Modified With a Cinnamoyl Group

Bis(3-aminopropyl) terminated poly(dimethylsiloxane) (25 g) (a molecular weight of about 2500) is dissolved in DMF (50 mL) and is refluxed at 60° C. Cinnamoyl chloride (3 g) is dissolved in DMF (50 mL) and is then added dropwise thereto. After a reaction for 5 hours, the solvent is removed using a rotary evaporator while being wrapped in aluminium foil so as to be shielded from light. Precipitation was carried out in distilled water (500 mL) and precipitate is isolated. The precipitate is dissolved in THF and ethyl ether and is then precipitated in hexane. It is dissolved in THF or xylene for a final use.

Manufacturing of an Adhesive Composition

PDMS 50 g modified with a cinnamoyl group as solid content 30 wt %, DC 7657 (Dow Corning, Michigan, US) 50 g, which is solid content 56.5 wt % as silicone adhesive, DC 7367 (Dow Corning) 2 g as a crosslinking agent, platinum catalyst 1 g, and DC 9250 (Dow Corning) 2 g as an anchorage agent are mixed with each other in such a manner as to form a silicone adhesive composition.

Formation of an Adhesive Layer

The manufactured silicone adhesive composition is bar coated onto PET film (50 μm) that is backing film and is irradiated with UV light for 3 minutes to be cured. The adhesive layer has a thickness of about 15 μm.

Evaluation

An evaluation is conducted in the same manner as that of exemplary embodiment 1.

TABLE 1

| Exemplary embodiment | Adhesive strength (g/in) | | | Transmittance (%) | Haze (%) |
|---|---|---|---|---|---|
| | Room temperature | 60° C., 90%, 40 hr | 85° C., 85%, 240 hr | | |
| 1 | 2250 | Good | Good | 95 | <1 |
| 2 | 2500 | Good | Good | 92 | <1 |

As seen in Table 1, an adhesive layer according to an exemplary embodiment has high adhesion, transmittance, and transparency. Further, the adhesive layer may include first and second areas that are different from each other in elastic modulus, and thus may achieve elasticity and also rigidity. Therefore, a light-transmissive adhesive film according to the exemplary embodiments is provided with elasticity and rigidity together.

From the foregoing, it will be appreciated that various exemplary embodiments have been described herein for purposes of illustration, and that various modifications may be made without departing from the scope and spirit of the present teachings. Accordingly, the various exemplary embodiments disclosed herein are not intended to be limiting of the true scope and spirit of the teachings and is indicated by the following claims, and equivalents thereof.

What is claimed is:

1. A light-transmissive adhesive film comprising:
    an adhesive layer in which an elastic modulus in a second area is higher than that in a first area; and
    one or more release layers on upper and lower portions of the adhesive layer;
    wherein the first area of the adhesive layer has a width more than twice as large as the thickness of the adhesive layer.

2. The light-transmissive adhesive film of claim 1, wherein the adhesive layer comprises the first and second areas that are alternately located.

3. The light-transmissive adhesive film of claim 1, wherein the adhesive layer comprises one or more second areas.

4. A light-transmissive adhesive film comprising:
an adhesive layer in which an elastic modulus in a second area is higher than that in a first area; and
one or more release layers on upper and lower portions of the adhesive layer; and
wherein the adhesive layer has an elastic modulus in a range of 0.2 MPa to 0.5 MPa in the first area.

5. The light-transmissive adhesive film of claim 1, wherein the adhesive layer comprises a polymer that is-photocrosslinkable.

6. The light-transmissive adhesive film of claim 5, wherein the polymer comprises an organic functional group that undergoes a reaction of [2+2] cycloaddition or photocleavage by ultraviolet light.

7. The light-transmissive adhesive film of claim 1, wherein the adhesive layer has a thickness in a range of 10 μm to 80 μm.

8. The light-transmissive adhesive film of claim 1, wherein the first area of the adhesive layer has a linear shape.

9. A display device comprising:
a display panel;
a first adhesive layer on a surface of the display panel; and
a polarizer on the first adhesive layer,
wherein the first adhesive layer has an elastic modulus in a second area, which is higher than that in a first area, and
wherein the first area of the adhesive layer has a width more than twice as large as the thickness of the adhesive layer.

10. The display device of claim 9, further comprising a second adhesive layer on the polarizer,
wherein the second adhesive layer has an elastic modulus in a second area, which is higher than that in a first area.

11. The display device of claim 10, further comprising a protective layer on the second adhesive layer.

12. The display device of claim 10, wherein the first area of the second adhesive layer has a smaller width than that of the first area of the first adhesive layer.

13. The display device of claim 9, further comprising a third adhesive layer on the other surface of the display panel,
wherein the third adhesive layer has an elastic modulus in a second area, which is higher than that in a first area.

14. The display device of claim 13, further comprising a support layer on the third adhesive layer.

15. The display device of claim 13, wherein the first area of the third adhesive layer has a larger width than that of the first area of the second adhesive layer.

16. The display device of claim 9, wherein the adhesive layer comprises the first and second areas that are alternately located.

17. The display device of claim 9, wherein the adhesive layer has an elastic modulus in a range of 0.2 MPa to 0.5 MPa in the first area.

18. The display device of claim 9, wherein the adhesive layer has a thickness in a range of 10 μm to 80 μm.

19. The display device of claim 9, wherein the display panel is an OLED.

20. The light-transmissive adhesive film of claim 1, wherein the adhesive comprises shape-memory polymers.

* * * * *